US008247271B2

(12) United States Patent
Andry et al.

(10) Patent No.: US 8,247,271 B2
(45) Date of Patent: Aug. 21, 2012

(54) FORMATION OF ALPHA PARTICLE SHIELDS IN CHIP PACKAGING

(75) Inventors: Paul Stephen Andry, Yorktown Heights, NY (US); Cyril Cabral, Jr., Mahopac, NY (US); Kenneth P. Rodbell, Sandy Hook, CT (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 917 days.

(21) Appl. No.: 12/200,352

(22) Filed: Aug. 28, 2008

(65) Prior Publication Data
US 2008/0318365 A1 Dec. 25, 2008

Related U.S. Application Data

(62) Division of application No. 11/211,116, filed on Aug. 24, 2005, now abandoned.

(51) Int. Cl.
*H01L 21/30* (2006.01)
(52) U.S. Cl. ........ 438/121; 438/107; 438/612; 438/613; 438/614; 438/618; 438/615; 438/667; 257/773; 257/E21.51
(58) Field of Classification Search .................. 438/121, 438/107, 612, 613, 614, 618, 615, 667; 257/773, 257/E21.51
See application file for complete search history.

(56) References Cited

U.S. PATENT DOCUMENTS

| 5,796,163 | A   | 8/1998 | Glenn et al. |
| 6,563,159 | B1  | 5/2003 | Kunikiyo et al. |
| 6,943,103 | B2  | 9/2005 | Kuo et al. |
| 2002/0056923 | A1 | 5/2002 | Wieczorek et al. |
| 2004/0088855 | A1* | 5/2004 | Akram ........................... 29/840 |
| 2005/0136634 | A1* | 6/2005 | Savastiouk et al. ............ 438/597 |
| 2007/0013073 | A1* | 1/2007 | Cabral et al. ................... 257/758 |

* cited by examiner

*Primary Examiner* — Junghwa M Im
(74) *Attorney, Agent, or Firm* — Schmeiser, Olsen & Watts; Louis J. Percello

(57) ABSTRACT

A structure fabrication method. First, an integrated circuit including N chip electric pads is provided electrically connected to a plurality of devices on the integrated circuit. Then, an interposing shield having a top side and a bottom side and having N electric conductors in the interposing shield is provided being exposed to a surrounding ambient at the top side but not at the bottom side. Next, the integrated circuit is bonded to the top side of the interposing shield such that the N chip electric pads are in electrical contact with the N electric conductors. Next, the bottom side of the interposing shield is polished so as to expose the N electric conductors to the surrounding ambient at the bottom side of the interposing shield. Then, N solder bumps are formed on the polished bottom side of the interposing shield and in electrical contact with the N electric conductors.

16 Claims, 10 Drawing Sheets

US 8,247,271 B2

FORMATION OF ALPHA PARTICLE SHIELDS IN CHIP PACKAGING

This application is a divisional application claiming priority to Ser. No. 11/211,116, filed Aug. 24, 2005, now abandoned.

BACKGROUND OF THE INVENTION

1. Technical Field

The present invention relates to integrated circuit packaging, and more specifically, to using alpha particle shields in integrated circuit packaging.

2. Related Art

In flip-chip technologies, solder bumps are typically formed on top of a semiconductor chip (i.e., integrated circuit IC). Each solder bump is formed directly on a bond pad of the chip. Then the chip is flipped face down and then aligned to a package/substrate so that the solder bumps are bonded directly, simultaneously, and one-to-one to the pads of the package/substrate (called package/substrate pads). However, for ceramic substrates, alpha particles (large subatomic fragments consisting of 2 protons and 2 neutrons) continuously emit from the substrate and enter the chip resulting in a large number of soft errors in the chip during the normal operation of the chip. Alpha particles are also generated from $^{210}$Pb contained in the solder bumps.

Therefore, there is a need for a structure (and a method for forming the same) that reduces the number of alpha particles that enter the chip.

SUMMARY OF THE INVENTION

The present invention provides a structure fabrication method, comprising providing an integrated circuit including N chip electric pads, wherein N is a positive integer, and wherein the N chip electric pads are electrically connected to a plurality of devices on the integrated circuit; providing an interposing shield having a top side and a bottom side and having N electric conductors in the interposing shield, wherein the N electric conductors are exposed to a surrounding ambient at the top side but not being exposed to the surrounding ambient at the bottom side; bonding the integrated circuit to the top side of the interposing shield such that the N chip electric pads are in electrical contact with the N electric conductors; polishing the bottom side of the interposing shield so as to expose the N electric conductors to the surrounding ambient at the bottom side of the interposing shield after said bonding the integrated circuit to the top side is performed; and forming N solder bumps on the polished bottom side of the interposing shield and in electrical contact with the N electric conductors.

The present invention also provides a structure fabrication method, comprising providing an integrated circuit including N chip electric pads, wherein N is a positive integer, and wherein the N chip electric pads are electrically connected to a plurality of devices on the integrated circuit; providing a semiconductor interposing shield having a top side and a bottom side and having N electric conductors in the semiconductor shield, wherein the N electric conductors are exposed to a surrounding ambient at the top side but not being exposed to the surrounding ambient at the bottom side; bonding the integrated circuit to the top side of the semiconductor interposing shield such that the N chip electric pads are in electrical contact with the N electric conductors; polishing the bottom side of the semiconductor interposing shield so as to expose the N electric conductors to the surrounding ambient at the bottom side of the semiconductor interposing shield after said bonding the integrated circuit to the top side is performed; forming N solder bumps on the polished bottom side of the semiconductor interposing shield and in electrical contact with the N electric conductors; after said forming the N solder bumps is performed, bonding a ceramic substrate that includes N substrate pads such that the N substrate pads are bonded to the N solder bumps, wherein the semiconductor interposing shield comprises essentially only silicon, and wherein the semiconductor interposing shield has a thickness of at least 50 μm after said polishing the bottom side is performed.

DETAILED DESCRIPTION OF THE INVENTION

Figure 1A:
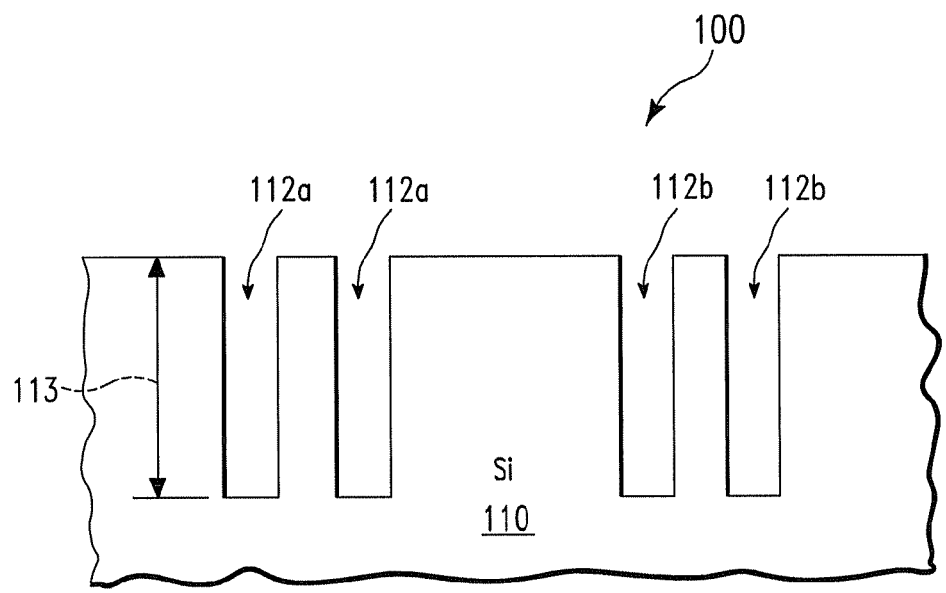
FIGS. 1-12 show the fabrication process for forming a structure, in accordance with embodiments of the present invention.
Figure 1B:
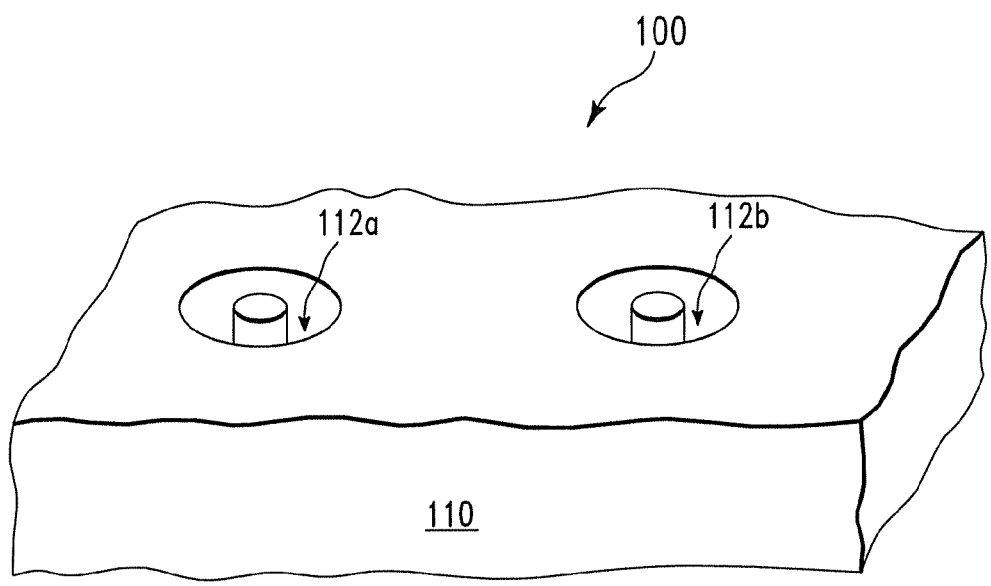

FIGS. 1-10 show the fabrication process for forming a structure 700 (FIG. 10), in accordance with embodiments of the present invention. More specifically, with reference to FIG. 1A, in one embodiment, the fabrication process starts out with an interposing shield 100 that comprises a semiconductor (e.g., silicon, germanium) layer 110. Next, in one embodiment, annular trenches 112a and 112b are formed in the semiconductor layer 110. Illustratively, the annular trenches 112a and 112b are formed using a photolithographic process. In one embodiment, the annular trenches 112a and 112b have a depth 113 of around 50-70 μm. FIG. 1B shows a perspective view of the interposing shield 100 of FIG. 1A.

Figure 2:
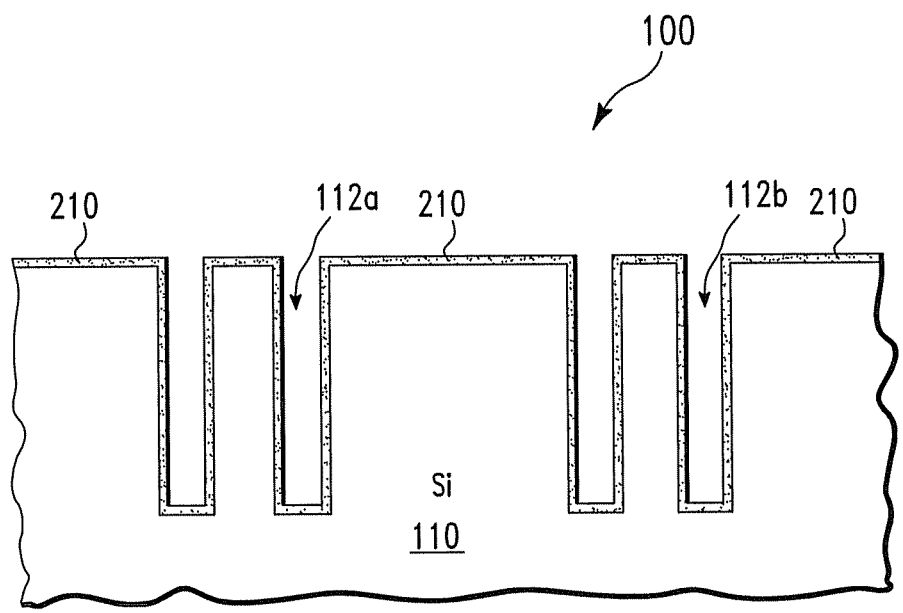

Next, with reference to FIG. 2, in one embodiment, a dielectric film 210 is formed on exposed-to-ambient silicon surfaces of the interposing shield 100 of FIG. 1A. As a result, the dielectric film 210 forms on, among other places, bottom walls and side walls of the annular trenches 112a and 112b. Illustratively, exposed-to-ambient silicon surfaces of the interposing shield 100 of FIG. 1 can be thermally oxidized so as to form silicon dioxide resulting in the dielectric film 210.

Figure 3:
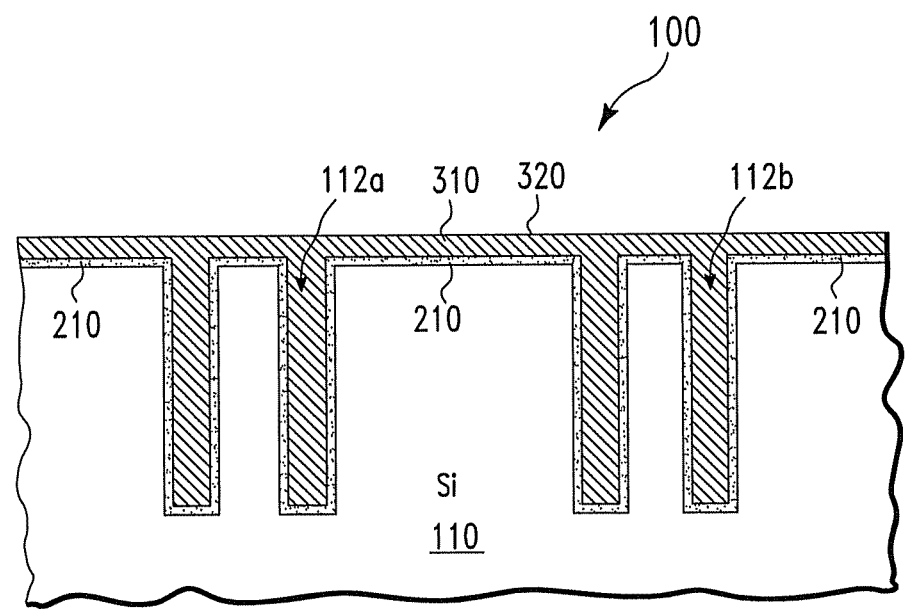

Next, with reference to FIG. 3, in one embodiment, an electrically conducting layer 310 is formed on top of the interposing shield 100 of FIG. 2 so as to completely fill the annular trenches 112a and 112b. Illustratively, the electrically conducting layer 310 comprises a metal (such as copper Cu) and is formed by CVD (chemical vapor deposition), ALD (atomic layer deposition), or electrochemical plating of the metal (i.e., Cu). It should be noted that if the metal used for the electrically conducting layer 310 is tungsten (W), a seed layer (not shown) of Ti or TiN needs to be formed first on top of the interposing shield 100 of FIG. 2 by PVD, CVD or ALD to serve as nuclei for the ensuing growth of tungsten to form the W electrically conducting layer 310. Likewise, it should be noted that if the metal used for the electrically conducting layer 310 is copper (Cu), a seed layer (not shown) of TaN, Ta and Cu needs to be formed first on top of the interposing shield 100 of FIG. 2 by PVD, CVD or ALD to serve as nuclei for the ensuing growth of copper to form the Cu electrically conducting layer 310.

Figure 4:
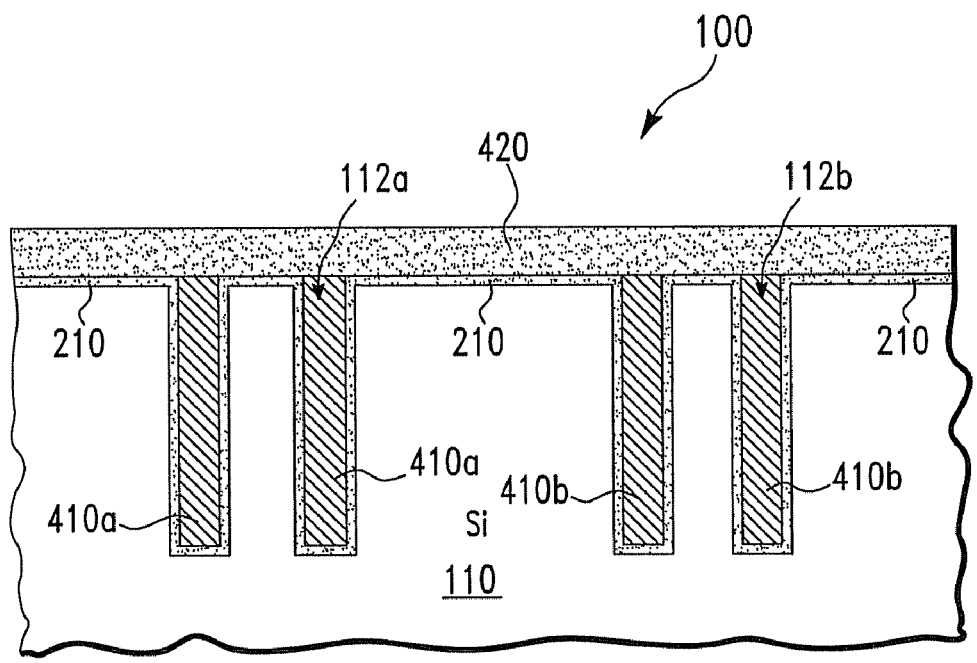

Next, in one embodiment, a chemical mechanical polishing (CMP) step is performed on top surfaces 320 of the interposing shield 100 of FIG. 3 until the dielectric film 210 is exposed to the surrounding ambient. The resulting interposing shield 100 is shown in FIG. 4 (without the top layer 420). What remains of the electrically conducting layer 310 after the CMP step resides in the annular trenches 112a and 112b and can be referred to as the annular electric conductors 410a and 410b (FIG. 4).

Next, with reference to FIG. 4, in one embodiment, a dielectric layer 420 is formed on top of the dielectric film 210 and in contact with the annular electric conductors 410a and 410b. Illustratively, the dielectric layer 420 comprises silicon dioxide and is formed by CVD of silicon dioxide.

Figure 5:
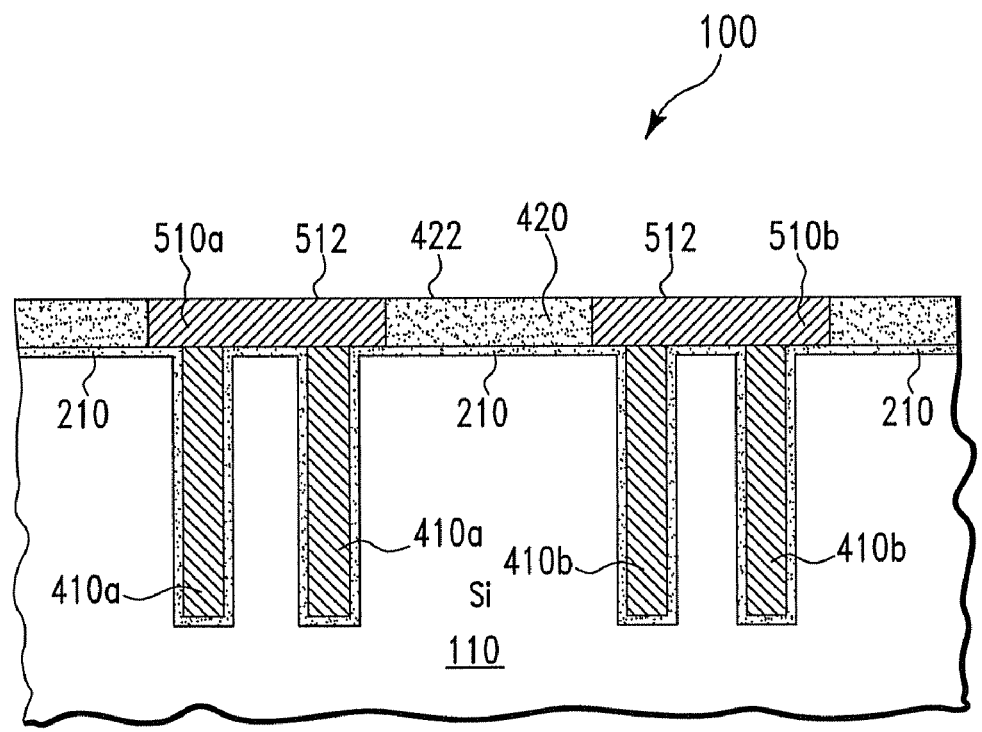

Next, with reference to FIG. 5, in one embodiment, electric pads 510a and 510b are formed in the oxide layer 420 and in direct physical contact with the annular electric conductors 410a and 410b, respectively. Illustratively, the electric pads 510a and 510b comprise copper and can be formed using a conventional damascene process. More specifically, the damascene process starts with etching trenches (which the electric pads 510a and 510b later occupy) in the oxide layer 420 using a conventional lithographic process. Next, copper is deposited (e.g., by electroplating) to fill the trenches. Finally, excess copper outside the trenches is removed by a CMP step resulting in the electric pads 510a and 510b as shown in FIG. 5.

Figure 6:
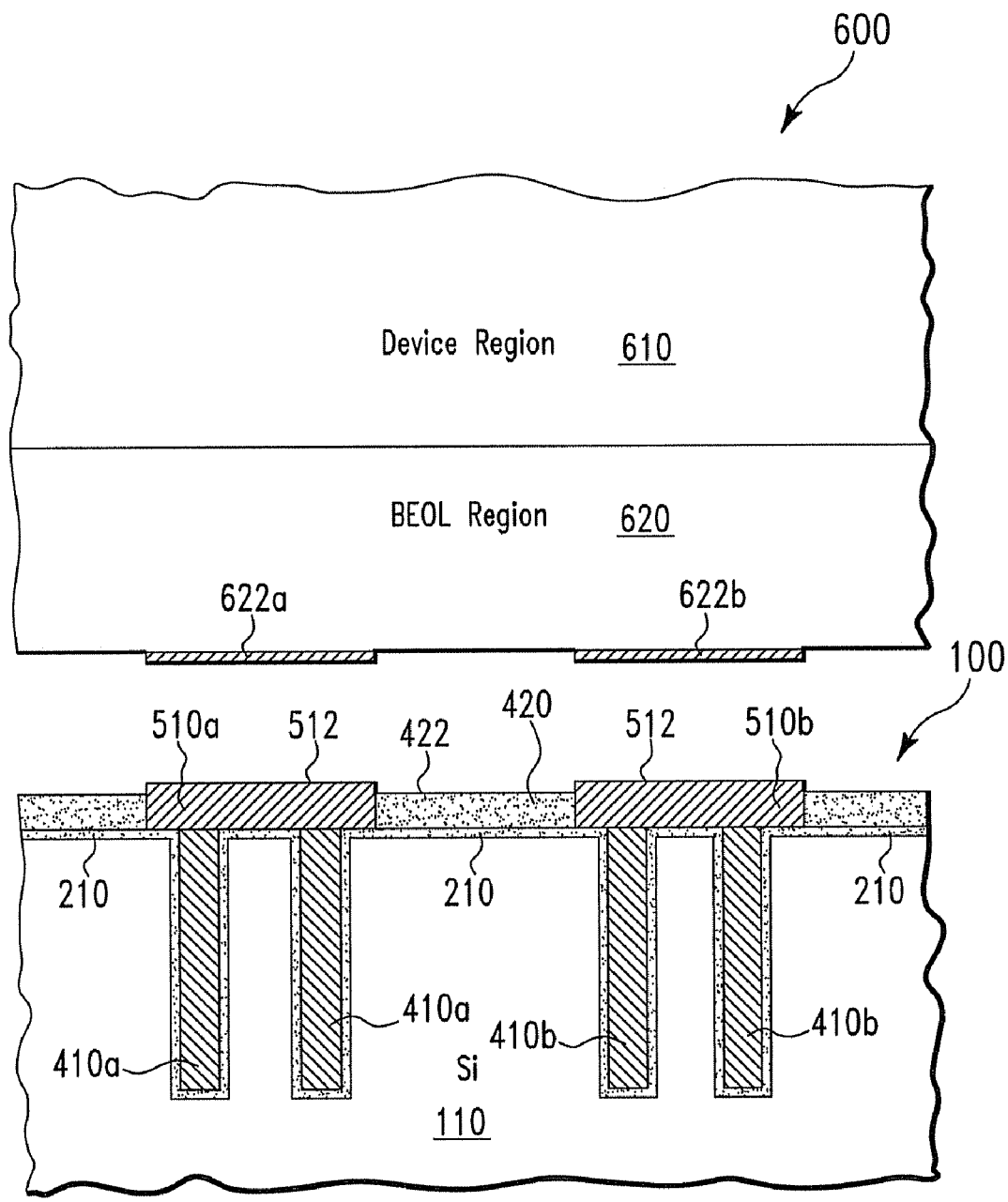

Next, in one embodiment, the oxide layer 420 is recessed so that its top surface 422 is lower than the top surfaces 512 of the electric pads 510a and 510b as shown in FIG. 6. In one embodiment, the oxide layer 420 is recessed by several thousand Å to 0.5 μm. Illustratively, the oxide layer 420 is recessed by a wet etch using a dilute hydrofluoric acid solution (HF).

Next, with reference to FIG. 6, in one embodiment, the interposing shield 100 is aligned with a semiconductor chip (integrated circuit IC) 600 such that the electric pads 622a and 622b of the semiconductor chip 600 are aligned with the electric pads 510a and 510b of the interposing shield 100, respectively. In one embodiment, the semiconductor chip 600 is fabricated separately from the fabrication of the interposing shield 100. Illustratively, the semiconductor chip 600 comprises a device region 610 and a back-end-of-line (BEOL) region 620. The device region 610 can comprise devices such as transistors, resistors, and capacitors (not shown). The (BEOL) region 620 can comprise electrically conducting lines (not shown) running in a dielectric material so as to (i) electrically connect the devices of the device region 610 together and (ii) electrically connect the devices of the device region 610 to the electric pads 622a and 622b.

Figure 7:
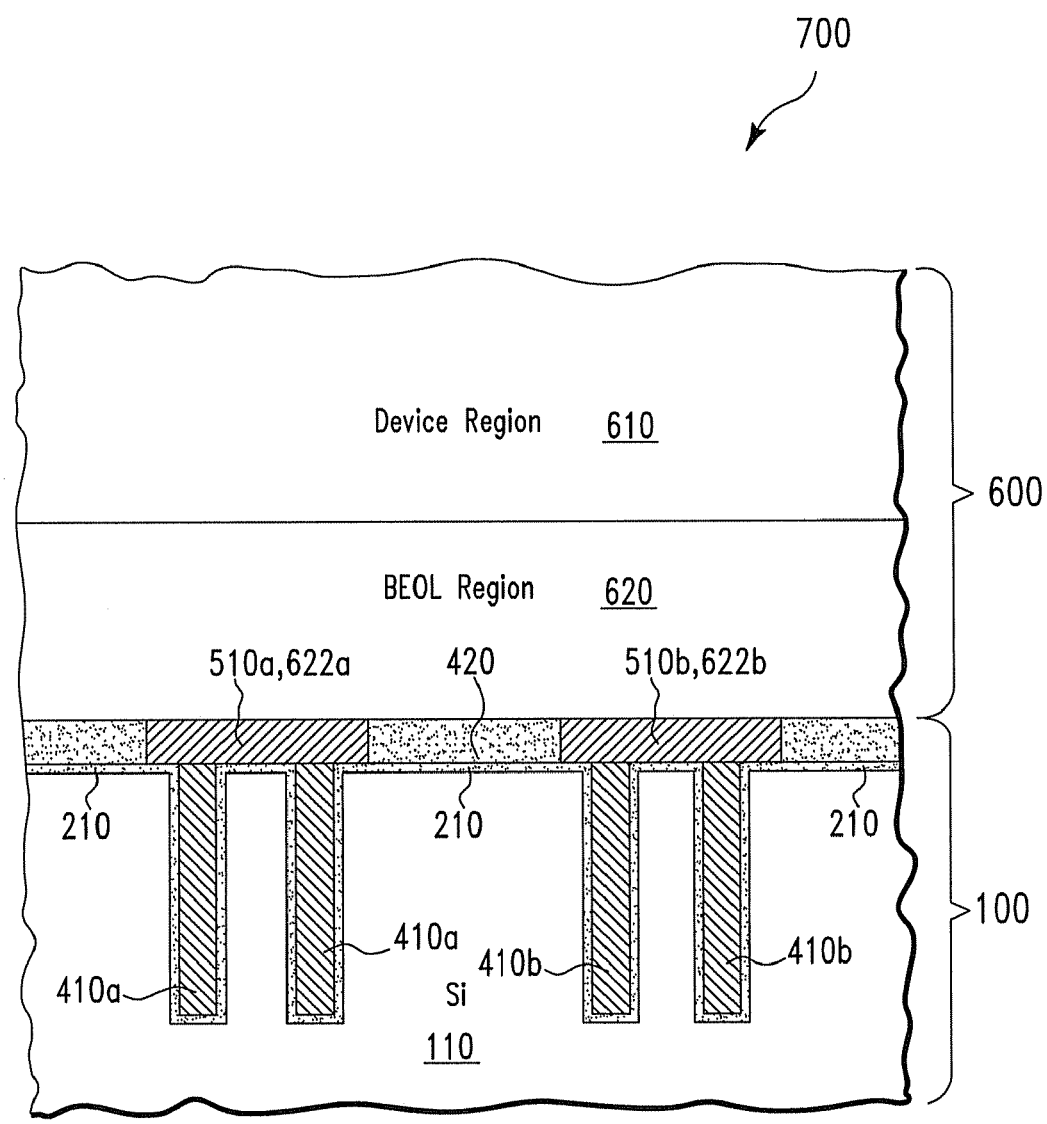

Next, with reference to FIG. 7, in one embodiment, the interposing shield 100 and the chip 600 are bonded together to form a structure 700 such that the electric pads 510a and 622a (FIG. 6) merge together to form an electric pad 510a,622a and such that the electric pads 510b and 622b (FIG. 6) merge together to form an electric pad 510b,622b. In one embodiment, the bonding process is performed at 350-400° C.

Figure 8:
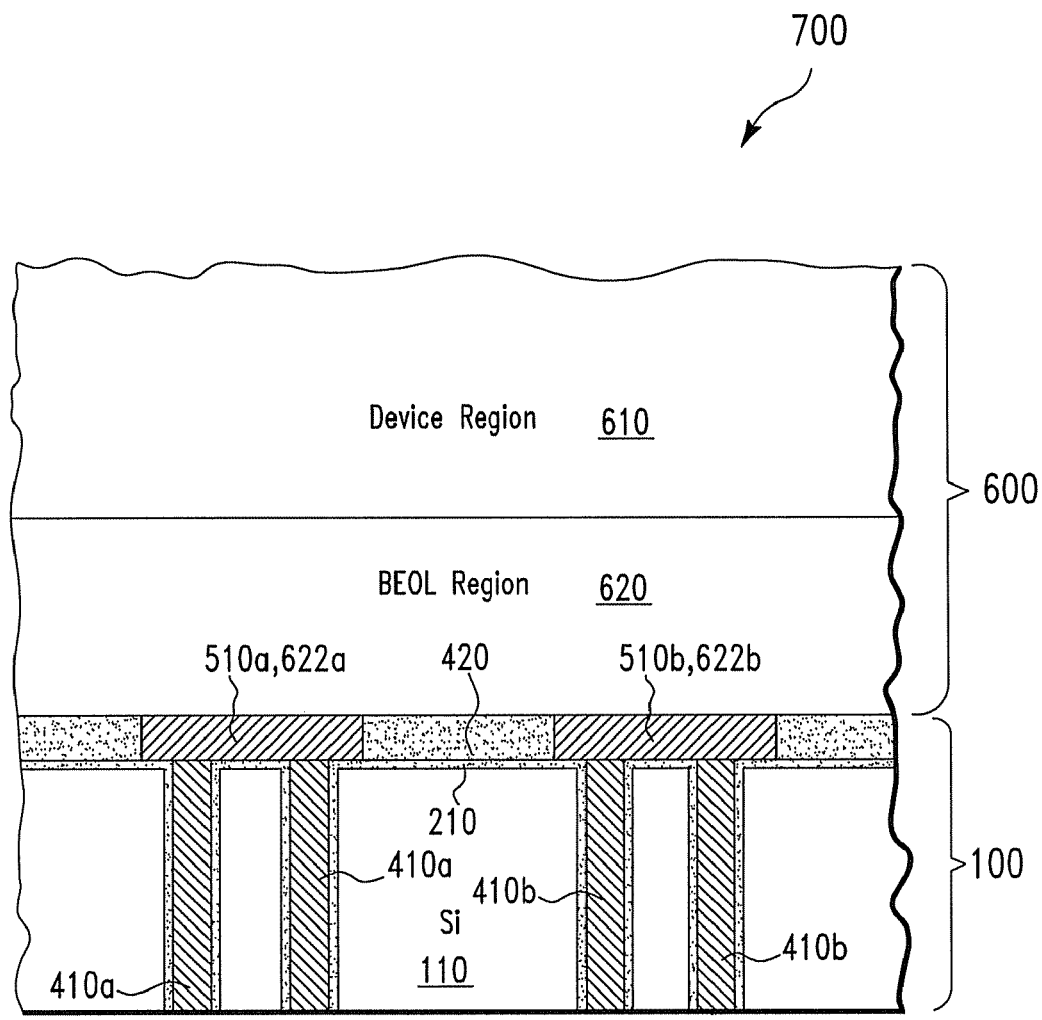

Next, with reference to FIG. 8, in one embodiment, the bottom side of the structure 700 is polished until the annular electric conductors 410a and 410b are exposed to the surrounding ambient. Illustratively, the bottom side of the structure 700 is mechanically ground by a mechanical grinding process only. Alternatively, the bottom side of the structure 700 is ground down by a mechanical grinding process until the annular electric conductors 410a and 410b are about to be exposed to the surrounding ambient. Then, a wet etch is performed on the bottom side of the structure 700 so as to expose the annular electric conductors 410a and 410b to the surrounding ambient.

Figure 9:
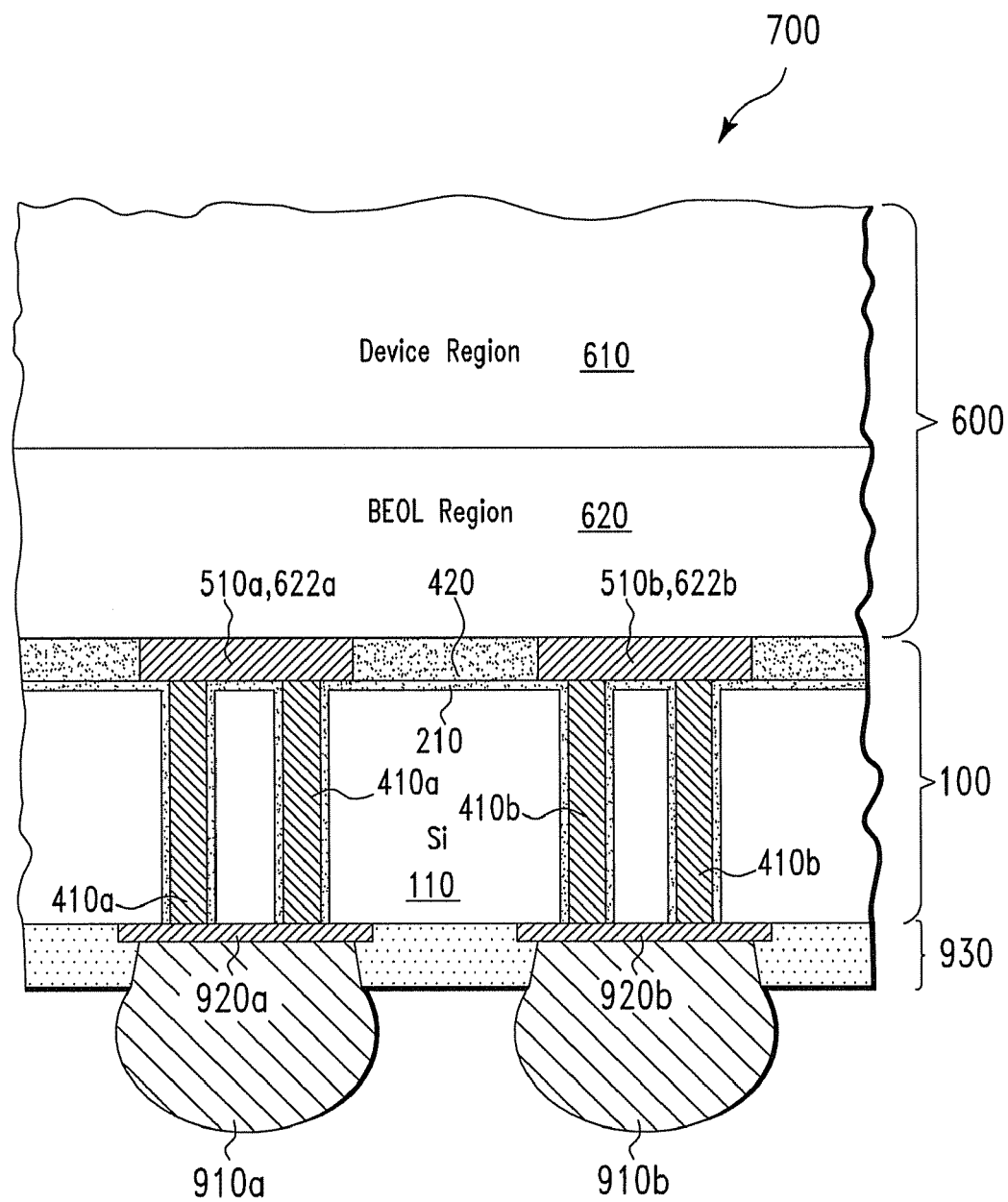

Next, with reference to FIG. 9, in one embodiment, solder bumps 910a and 910b are formed on bottom side of the structure 700 and in electrical contact with the annular electric conductors 410a and 410b, respectively, using a conventional solder bump formation process (also known as the flip chip technologies). The resulting structure 700 is shown in FIG. 9. The solder bumps 910a and 910b are electrically connected to the annular electric conductors 410a and 410b via electric chip pads 920a and 920b, respectively. Illustratively, the electric chip pads 920a and 920b comprises aluminum. Although not shown, between the solder bumps 910a and 910b and the aluminum chip pads 920a and 920b is a ball limiting metallurgy (BLM) (illustratively comprising TiW/CuCr/Cu). The rest of the bottom side of the structure 700 is covered by a polyimide layer 930 which is a dielectric material.

Figure 10:
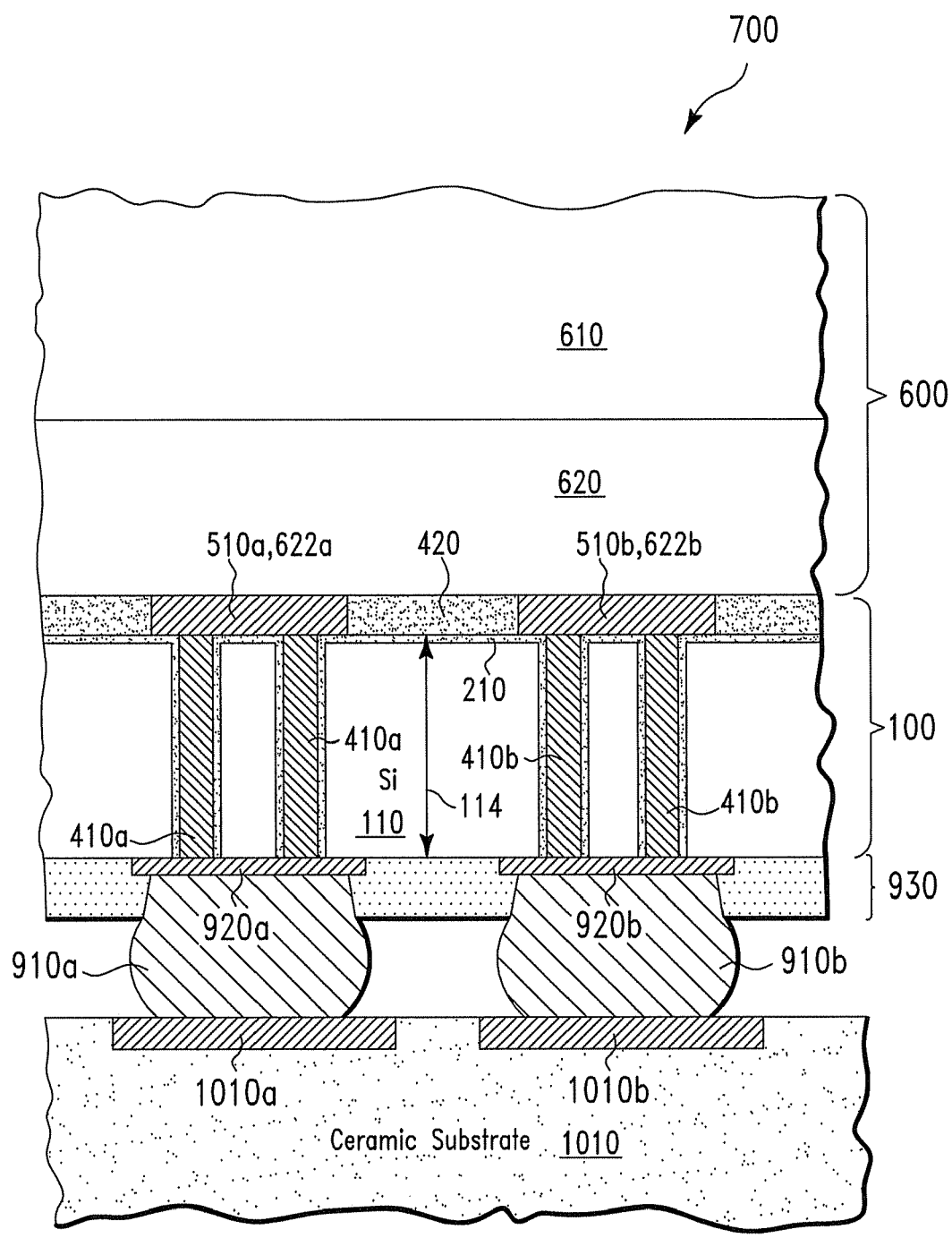

Next, with reference to FIG. 10, in one embodiment, a ceramic substrate 1010 is bonded with the structure 700 such that substrate pads 1010a and 1010b of the ceramic substrate 1010 are bonded with the solder bumps 910a and 910b, respectively. Illustratively, the substrate pads 1010a and 1010b comprises aluminum.

Next, in one embodiment, the structure 700 is placed in a package (not shown) having package pins (not shown) that are electrically connected to the substrate pads 1010a and 1010b via metal lines (not shown).

In summary, with reference to FIG. 10, the interposing shield 100 is sandwiched between the ceramic substrate 1010 and the semiconductor chip 600. As a result, the interposing shield 100 helps reduce the alpha particles that are generated by the ceramic substrate 1010 and enter the semiconductor chip 600. The interposing shield 100 also helps reduce the alpha particles that are generated by the solder bumps 910a and 910b (i.e. Pb).

In one embodiment, the thickness 114 of the interposing shield 100 is sufficiently large such that at least a pre-specified percentage of alpha particles entering the interposing shield 100 from the ceramic substrate 1010 do not pass through the interposing shield 100 so as to reach the semiconductor chip 600.

It should be noted that the thickness 114 of the interposing shield 100 is essentially the depth 113 (FIG. 1A) of the annular trenches 112a and 112b of FIG. 1A. As a result, with the depth 113 (FIG. 1A) of around 50-70 μm, the thickness 114 of the silicon interposing shield 100 is also around 50-70 μm and therefore is sufficiently thick to prevent most of the alpha particles generated by the ceramic substrate 1010 from entering the semiconductor chip 600.

It should also be noted that the annular electric conductors 410a and 410b provide electric paths from the solder bumps 910a and 910b to the devices (not shown) of the semiconductor chip 600 (via the electric pads 510a,622a and electric pad 510b,622b, respectively). The annular shape is chosen for the electric conductors 410a and 410b so as to save metal material during the step of filling the trenches 112a and 112b (FIG. 3) to form the electric conductors 410a and 410b. Moreover, because the trenches 112a and 112b (FIG. 3) are filled fast, the excess metal outside the trenches 112a and 112b (FIG. 3) are less, and therefore, the ensuing removal of the excess metal becomes easier. In general, the trenches 112a and 112b (FIG. 3) can have any shape and size.

It should be noted that the solder bumps 910a and 910b may comprise a tin-lead alloy which itself generates alpha particles. Because the interposing shield 100 is sandwiched between the solder bumps 910a and 910b and the semiconductor chip 600, the interposing shield 100 also helps reduce the alpha particles that enter the semiconductor chip 600 from the solder bumps 910a and 910b.

In one embodiment, the structure 700 comprises a dielectric layer (not shown) that electrically insulates the electric chip pads 920a and 920b from the silicon region of the silicon layer 110 such that there is no electrically conducting path between the electric chip pads 920a and 920b through the silicon region of the silicon layer 110.

In the embodiments above, there are two trenches 112a and 112b (FIG. 1A) formed. In general, there can be N trenches formed, wherein N is a positive integer. As a result, there are N solder bumps (like the solder bumps 910a and 910b) electrically connected one-to-one to N electric pads (like the electric pad 510a,622a and 510b,622b) through N electric conductors (like the electric conductors 410a and 410b).

Figure 11:
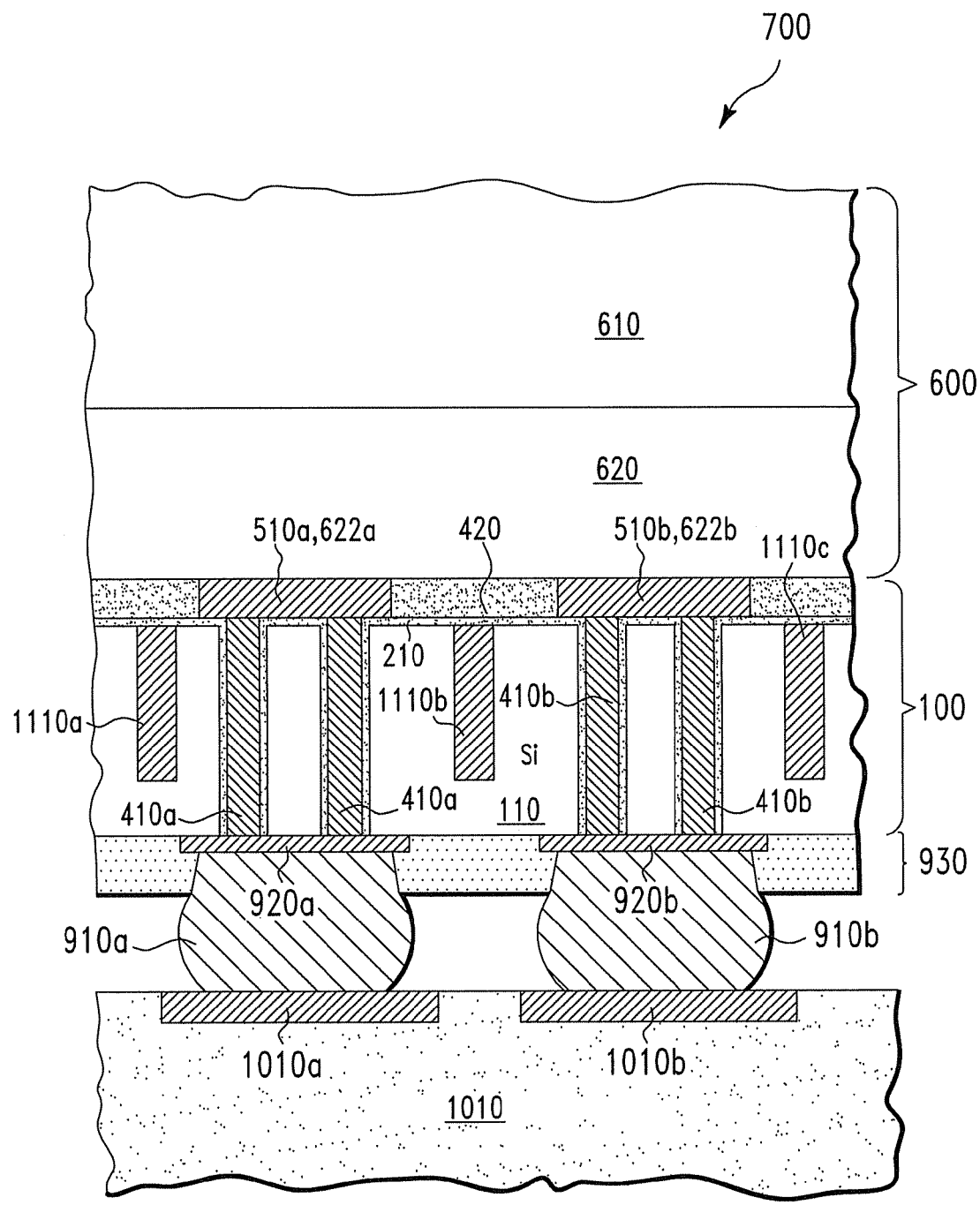

In one embodiment, with reference to FIG. 11, metal (e.g., copper) regions 1110a, 1110b, and 1110c are formed in the semiconductor regions of the interposing shield 100 such that the metal regions are electrically insulated from the electric conductors 410a and 410b. Because copper is better than silicon in absorbing alpha particles, the interposing shield 100 with such embedded copper regions performs better in preventing alpha particles from reaching the semiconductor chip 600. Illustratively, the copper regions can be formed by creating trenches (not shown) similar to the trenches 112a and 112b (FIG. 1A) and filling these trenches with copper.

Figure 12:
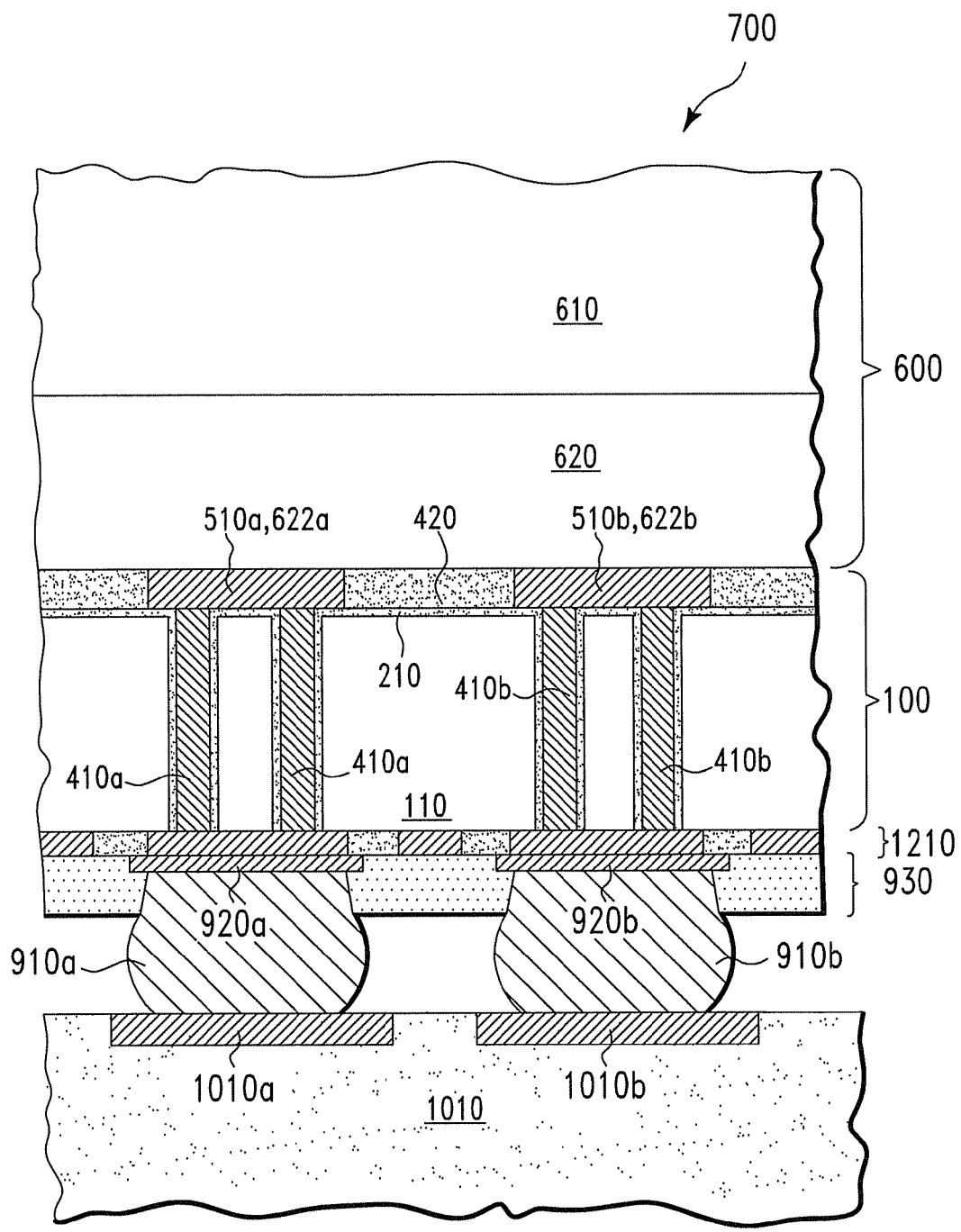

In one embodiment, a metal (e.g., copper) layer 1210 (FIG. 12) may be formed on the bottom side of the structure 700 of FIG. 8. Then, the solder bumps 910a and 910b are formed as described above. Additional conventional fabrication steps are needed after the copper layer is formed and before the solder bumps 910a and 910b are formed so that the copper layer is sandwiched between, and electrically insulated from, the electric conductors 410a and 410b and the solder bumps 910a and 910b. The resulting structure 700 is shown in FIG. 12. Because copper is better than silicon in absorbing alpha particles, the interposing shield 100 with the copper layer performs better in preventing alpha particles from reaching the semiconductor chip 600. It should be noted that a dielectric layer (not shown) electrically insulates the copper layer 1210 from the silicon regions of the silicon interposing shield 100. In one embodiment, the thickness of the copper layer 1210 is about one third of the thickness of the silicon interposing shield 100. In one embodiment, the thickness of the copper layer 1210 is less than 15 µm and the silicon interposing shield 100 has a thickness in a range of 30 µm–70 µm. If the thickness of the copper layer 1210 is increased, the thickness of the silicon interposing shield 100 can be reduced. This means that the depth 113 (FIG. 1A) of the trenches 112a and 112b (FIG. 1A) can be reduced. In one embodiment, the copper layer has a thickness in a range of 10 µm–15 µm, which is sufficient by itself in blocking alpha particles, and therefore, the thickness of the silicon interposing shield 100 can be less than 1 µm or even zero (i.e., silicon interposing shield 100 can be omitted).

In one embodiment, the silicon regions of the semiconductor interposing shield 100 are doped with boron atoms (using, illustratively, ion implantation). This enhances the capability of the semiconductor interposing shield 100 in preventing cosmic thermal neutrons from passing through the semiconductor interposing shield 100 and reach the semiconductor chip 600. The cosmic thermal neutrons undergo reactions with the B that emit <2 MeV alpha particles. Therefore it is advantageous to have this B doped region on the top of the Si interposer layer (on the opposite side from the semiconductor device).

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure fabrication method, comprising:
providing an integrated circuit including N chip electric pads, wherein N is a positive integer, and wherein the N chip electric pads are electrically connected to a plurality of devices on the integrated circuit;
providing an interposing shield having a top side and a bottom side and having N electric conductors in the interposing shield, wherein the N electric conductors are exposed to a surrounding ambient at the top side but not being exposed to the surrounding ambient at the bottom side, wherein N is at least 2;
bonding the integrated circuit to the top side of the interposing shield such that the N chip electric pads are in electrical contact with the N electric conductors;
polishing the bottom side of the interposing shield so as to expose the N electric conductors to the surrounding ambient at the bottom side of the interposing shield after said bonding the integrated circuit to the top side is performed; and
forming N solder bumps on the polished bottom side of the interposing shield and in electrical contact with the N electric conductors,
wherein the interposing shield comprises a shield material,
wherein the shield material comprises a first semiconductor material,
wherein each electric conductor of the N electric conductors comprises an electrical pad,
wherein said bonding comprises bonding the integrated circuit to the top side of the interposing shield such that the N chip electric pads are in electrical contact and direct physical contact with corresponding electrical pads of the N electric conductors,
wherein after said bonding and before said polishing, the shield material covers the N electric conductors in a manner that the N electric conductors are not exposed to the surrounding ambient, and
wherein said polishing removes a sufficient amount of the shield material to expose the N electric conductors to the surrounding ambient.

2. The method of claim 1, further comprising, after said forming the N solder bumps is performed, bonding a ceramic substrate that includes N substrate pads such that the N substrate pads are bonded to the N solder bumps.

3. The method of claim 1, wherein the first semiconductor material is the only semiconductor material in the interposing shield.

4. The method of claim 1, wherein said providing the interposing shield comprises:
providing a semiconductor layer;
creating N trenches in the semiconductor layer;
filling the N trenches with an electrically conducting material so as to form the N electric conductors, wherein the semiconductor layer, after said filling the N trenches is performed, comprises the interposing shield.

5. The method of claim 1, wherein the N solder bumps are electrically connected to corresponding electric conductors of the N electric conductors via corresponding electrical chip pads, and wherein each electrical chip pad is disposed between and in direct physical contact with the corresponding solder bump and the corresponding electric conductor.

6. The method of claim 3, wherein the interposing shield has a thickness of at least 50 µm after said polishing the bottom side is performed.

7. The method of claim 4, wherein said providing the interposing shield further comprises forming a dielectric layer on side walls of the N trenches before said filling the N trenches is performed.

8. The method of claim 4, wherein each trench of the N trenches has an annular shape.

9. The method of claim 3, wherein the semiconductor material consists of silicon.

10. A structure fabrication method, comprising:
providing an integrated circuit including N chip electric pads, wherein N is a positive integer, and wherein the N chip electric pads are electrically connected to a plurality of devices on the integrated circuit;
providing an interposing shield having a top side and a bottom side and having N electric conductors in the interposing shield, wherein the N electric conductors are exposed to a surrounding ambient at the top side but not being exposed to the surrounding ambient at the bottom side, wherein N is at least 2, wherein the interposing shield comprises a first semiconductor material;
bonding the integrated circuit to the top side of the interposing shield such that the N chip electric pads are in electrical contact with the N electric conductors;
polishing the bottom side of the interposing shield so as to expose the N electric conductors to the surrounding ambient at the bottom side of the interposing shield after said bonding the integrated circuit to the top side is performed;
forming N solder bumps on the polished bottom side of the interposing shield and in electrical contact with the N electric conductors;
after said forming the N solder bumps is performed, bonding a ceramic substrate that includes N substrate pads such that the N substrate pads are bonded to the N solder bumps; and
forming M copper regions within the interposing shield, wherein M is at least 2, wherein each copper region comprises copper, wherein a first direction from the top side to the bottom side is perpendicular to both the bottom side and the top side, wherein each copper region has a length oriented in the first direction and a width oriented in a second direction perpendicular to the first direction, wherein the length exceeds the width of each copper region, wherein each electric conductor has a length oriented in the first direction and a width oriented in the second direction, wherein the length exceeds the width of each electric conductor.

11. The method of claim 10, wherein the length of each copper region is less than the length of each electric conductor.

12. The method of claim 10, wherein N exceeds M.

13. The method of claim 12, wherein N=M+1.

14. The method of claim 13, wherein M is at least 3, and wherein the N electric conductors and the M copper regions are distributed in the second direction in a spatial sequence of C1, E1, E2, C2, E3, E4, C3, . . . , wherein Cm denotes copper region m for m=1, 2, . . . , M, and wherein En denotes electric conductor n for n=1, 2, . . . , N.

15. A structure fabrication method, comprising:
providing an integrated circuit including N chip electric pads, wherein N is a positive integer, and wherein the N chip electric pads are electrically connected to a plurality of devices on the integrated circuit;
providing an interposing shield having a top side and a bottom side and having N electric conductors in the interposing shield, wherein the N electric conductors are exposed to a surrounding ambient at the top side but not being exposed to the surrounding ambient at the bottom side, wherein N is at least 2, wherein the interposing shield comprises a first semiconductor material;
bonding the integrated circuit to the top side of the interposing shield such that the N chip electric pads are in electrical contact with the N electric conductors;
polishing the bottom side of the interposing shield so as to expose the N electric conductors to the surrounding ambient at the bottom side of the interposing shield after said bonding the integrated circuit to the top side is performed;
forming N solder bumps on the polished bottom side of the interposing shield and in electrical contact with the N electric conductors;
after said forming the N solder bumps is performed, bonding a ceramic substrate that includes N substrate pads such that the N substrate pads are bonded to the N solder bumps; and
forming a copper layer sandwiched between, and electrically insulated from, the N electric conductors and the N solder bumps.

16. The method of claim 15, wherein a first direction from the top side to the bottom side is perpendicular to both the bottom side and to top side, wherein the copper layer has a thickness in a range of 10 μm to 15 μm in the first direction, and wherein the interposing shield has a thickness less than 1 μm in the first direction.

* * * * *